United States Patent [19]
Miller et al.

[11] 3,947,952
[45] Apr. 6, 1976

[54] METHOD OF ENCAPSULATING BEAM LEAD SEMICONDUCTOR DEVICES

[75] Inventors: Thomas Samuel Miller, Allentown; Malcolm Lunt White, Bethlehem, both of Pa.

[73] Assignee: Bell Telephone Laboratories, Incorporated, Murray Hill, N.J.

[22] Filed: July 15, 1974

[21] Appl. No.: 488,808

Related U.S. Application Data

[63] Continuation-in-part of Ser. No. 101,475, Dec. 28, 1970, abandoned.

[52] U.S. Cl. ............... 29/578; 29/580; 156/17; 427/93
[51] Int. Cl.² ............................................ B01J 17/00
[58] Field of Search ............ 29/578, 580, 588, 583, 29/627; 117/161 ZA, 5.5, 8.5, 212; 156/17

[56] References Cited
UNITED STATES PATENTS

| | | |
|---|---|---|
| 3,132,046 | 5/1964 | Mann ............................... 117/212 |
| 3,193,418 | 7/1965 | Cooper ............................. 29/578 |
| 3,458,351 | 7/1969 | Held ................................ 117/212 |
| 3,466,741 | 9/1969 | Wiesner ........................... 29/588 |
| 3,550,261 | 12/1970 | Schroeder ......................... 29/580 |
| 3,590,478 | 7/1971 | Takehanna ........................ 29/578 |
| 3,750,269 | 8/1973 | Small ............................... 29/580 |
| 3,771,219 | 11/1973 | Tuzi ................................. 29/580 |

*Primary Examiner*—W. Tupman
*Attorney, Agent, or Firm*—H. W. Lockhart

[57] ABSTRACT

Plastic encapsulation in the form of a thin film of silicone resin is provided on the active surface of beam lead semiconductor chips by a multistep process. An etchable organic film, for example, of silicone resin, is applied to the chips while they are still in wafer form. A mask is formed on top of the resin having a pattern conforming to the underlying semiconductor chips. The exposed resin overlying the intervening beam lead grid portion is then dissolved, after which the mask is removed. The final step is the standard wafer separation which leaves each semiconductor chip with a thin silicone resin coating over the active surface thereof.

3 Claims, 10 Drawing Figures

METHOD OF ENCAPSULATING BEAM LEAD SEMICONDUCTOR DEVICES

CROSS REFERENCE TO RELATED APPLICATION

This application 101,475 a continuation-in-part of our copending application, Ser. No. 101,161,475 filed Dec. 28, 1970, now abandoned.

This invention relates to semiconductor device fabrication and more particularly to a method for providing a plastic protective film on individual beam lead type semiconductor chips while they are in wafer form prior to wafer separation.

BACKGROUND OF THE INVENTION

In recent years it has become possible to discard the relatively massive vacuum type housings and encapsulations used for protectively enclosing semiconductor devices. This has occurred because of the development of surface passivation films comprised generally of inorganic components, typically oxides and nitrides of silicon as well as certain other elements. There are also useful for this purpose a variety of coatings which may be characterized as glasses and which contain particular elements tailored to passivate the surface conditions of semiconductor devices.

However, despite the electronic passivation of semiconductor devices by such means it has remained desirable to provide some protection for the active portion of the device, at least from gross contamination, and for mechanical purposes, particularly during assembly of the device into various apparatus. More particularly, the organic coating provides final humidity protection on the active surface of the device. For this purpose, certain organic polymers, in particular, silicone resins, are used. Various arrangements have been devised for applying such resin films, almost exclusively after formation of the individual device and after mounting in apparatus assemblies. Applying such protective film at this point is undesirable inasmuch as the beam lead device is usually bonded with the active surface toward the mounting substrate. Applying resin to the active surface of the device is costly and unlikely to cover completely without undue spreading.

SUMMARY OF THE INVENTION

In accordance with this invention the protective film of resin is formed only upon the active device surface of the semiconductor chip and is accomplished conveniently and economically while the elements are still in wafer form and just prior to their separation into individual chips. The completely device-processed wafer containing an array of several hundred or more beam lead type semiconductor chips and having a passivating film of, typically, silicon dioxide and silicon nitride applied thereto, then is coated with a very thin film of silicone resin. There then is formed on the surface of the resin a masking pattern conforming to the outline of each underlying semiconductor chip or to a portion of that outline encompassing a particular area over which protection is desired. Using a suitable solvent the exposed resin is removed in the areas corresponding to the portions intervening the semiconductor chips of the array. Typically, this intervening area constitutes a grid portion of the wafer carrying the beam lead connectors projecting from each semiconductor chip which portion is later to be removed.

Following this step of delineating the pattern in the silicone resin the remaining mask portions are removed by a suitable solvent after which the wafer is inverted and a wafer separation mask applied, followed by the customary wafer separation process. Thus, the wafer is divided into a plurality of individual beam lead semiconductor chips each having a thin silicone resin film only on the active face thereof. Each chip thus is available for assembly into apparatus by mounting on suitable substrates typically using thermocompression bonding of the beam leads.

The process thus enables the application of the protective plastic film only where needed and particularly not over or around the beam lead connectos where the presence of such plastic would inhibit proper thermocompression bonding.

BRIEF DESCRIPTION OF THE DRAWING

The invention and its objects and features will be more clearly understood from the following detailed description taken in conjunction with the drawing in which.

DETAILED DESCRIPTION

Figure 1:
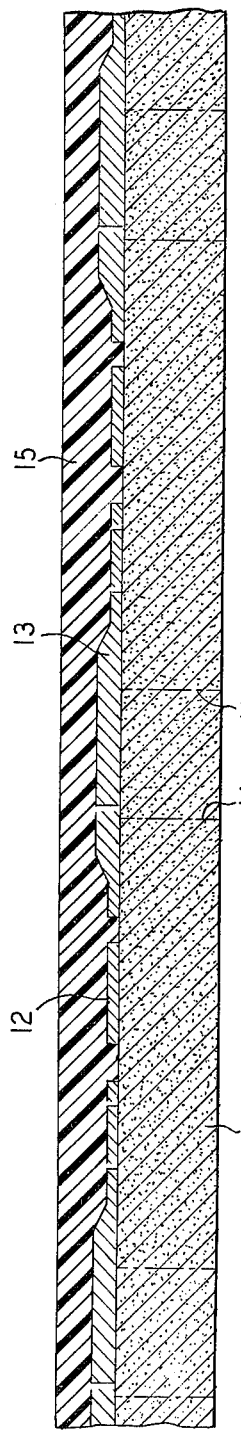
FIGS. 1 through 5 and 7 through 9 are sectional views taken through a portion of a semiconductor wafer containing beam lead semiconductor chips illustrating steps in the process in accordance with this invention.

FIG. 1 illustrates the first step in the process of applying a protective coating to beam lead semiconductor devices. A wafer of semiconductor material, usually of a circular or oval configuration and having a diameter of about 2 inches and a thickness of several mils, is subjected to a succession of oxidation, masking, diffusion and metal deposition steps to form therein an array of semiconductor devices including metal interconnection patterns and supporting projecting interconnections called beam leads. In FIG. 1 a portion of a semiconductor wafer 11 is shown. On the surface of the semiconductor material 11 is a pattern of metal interconnections 12 having thicker portions 13. The portions 13 ultimately constitute the supporting beam lead members after wafer separation is accomplished by removal of the material intervening the broken lines 14. Although not shown, the semiconductor portion 11 may contain a plurality of zones of differing conductivity type so as to constitute an array of transistors, diodes, resistors, as well as other electronic elements.

In accordance with the first step in the process of applying a protective cap, a thin film 15 of silicone resin is applied over the entire surface of the wafer portion 11. One suitable material is a silicone resin DC-648, available from the Dow Corning Corporation, Midland, Mich. This resin film may be applied to a suitable thickness of from about 0.1 to 0.3 mil by applying the resin to the slice surface usine a syringe and then spinning the slice at about 6000 r.p.m. for 20 seconds. It is desirable to remove any resin from the back side of the slice at this stage by the use of trichloroethylene.

Next, the resin film is cured by baking the slice in an air oven in accordance with the following schedule: 120° C. for 15 minutes, 150° C. for 15 minutes and 250° to 300° C. for 15 minutes. If the desired resin thickness has not been realized, the application and curing process may be repeated until a suitable thickness is achieved. Typically, useful film thicknesses are from about 0.1 to 0.3 mil. Finally, the resin is cured at about 300° C. for at least four hours. This last step causes the final cure of the resin and may be done at lower temperatures for longer times, e.g., at 250° C. for 16 hours.

Figure 2:
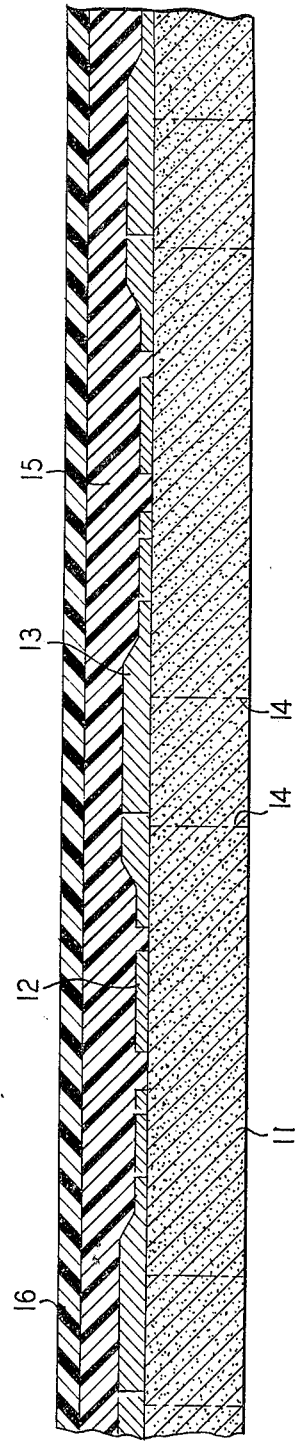
Figure 3:
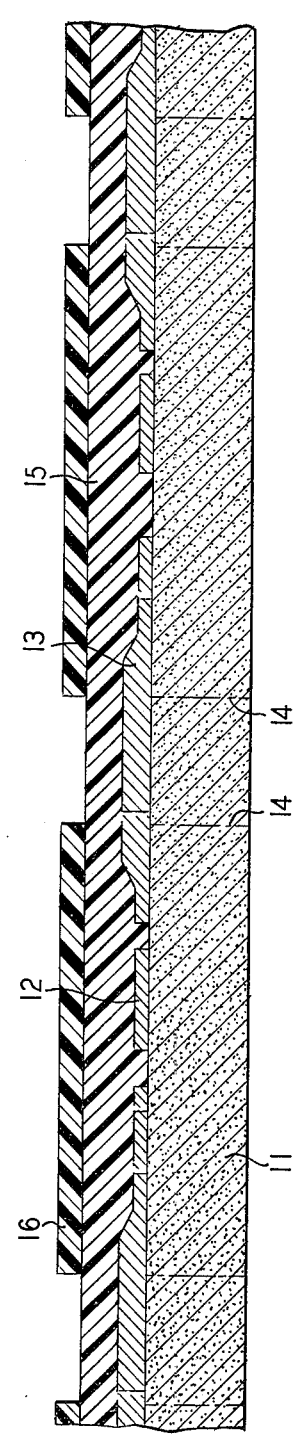

In accordance with the next step of the method a film 16 is formed on the surface of the resin as shown in FIG. 2. One useful film comprises a layer of Kodak thin film resist applied by a technique similar to that described above for the silicone resin film 15. Next, using well-known exposure and development methods, the photoresist film 16 is removed in certain portions, as shown in FIG. 3, to delineate a pattern corresponding to the underlying final semiconductor chips.

Figure 4:
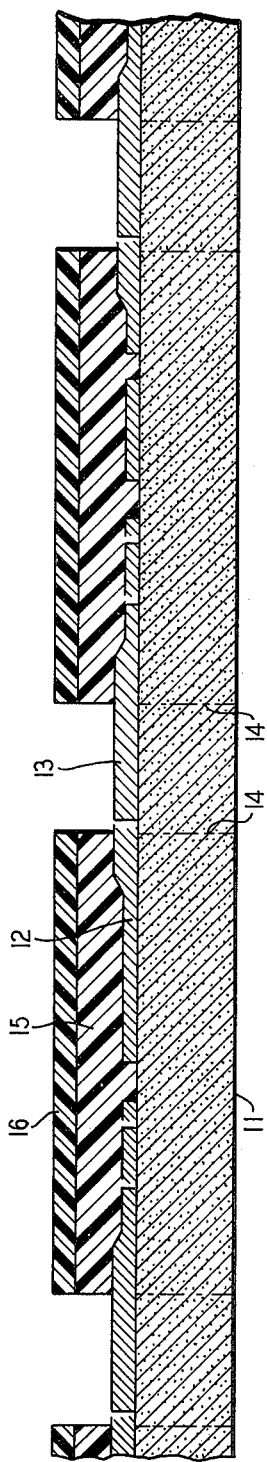

After rinsing and cleaning, the unmasked portions of the silicone resin film are etched out as shown in FIG. 4, using a stripping solution comprising 70 volumes of n-methyl-2-pyrrolidinone (NMP) and 7 volumes of tetramethlyammonium hydroxide (TMAH, 24% in methanol) and 150 volumes isopropyl alcohol. About one minute usually suffices to remove the typical thickness of resin. The etch time may be reduced by reducing the amount of isopropyl alcohol. Other solvents suitable for resin stripping are disclosed in U.S. Pat. No. 3,673,099 granted to Corby, Garbarini and White on June 27, 1972.

Figure 5:
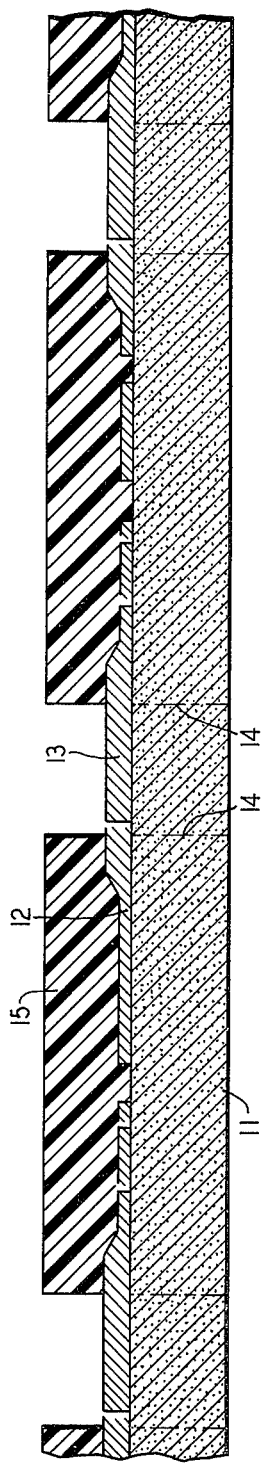
Figure 10:
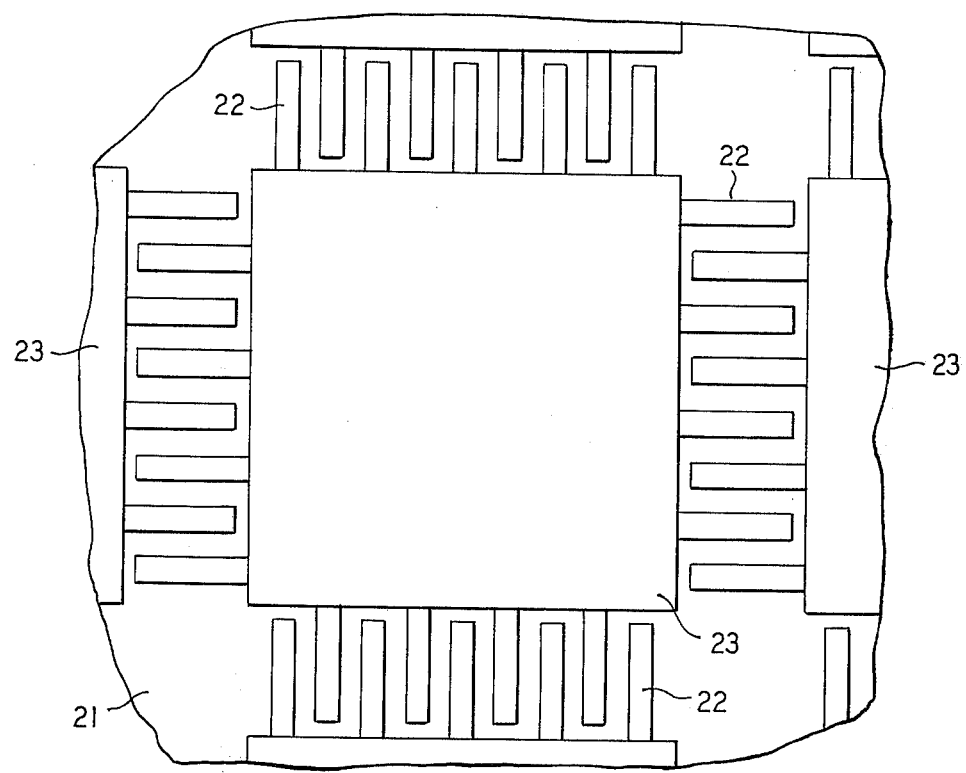
FIG. 10 is a plan view of a portion of the wafer after formation of the protective resin coating and prior to wafer separation as shown in the sectional view of FIG. 5.

After rinsing, cleaning and inspection to insure proper delineation of the resin pattern the remaining photoresist is removed using trichloroethylene, electronic grade, applied advantageously by spraying. Other solvents may be used subject to the condition that they do not attack the silicone resin film 15. The structure then is as shown in FIG. 5 in which the devices are still in wafer form with a silicone resin film 15 over only the active area of each device. The appearance of a portion of the wafer at this point in the process is as shown in FIG. 10. The silicone resin protective film 23 covers the active area of each device while the beam leads 22 are clearly exposed on the surface of the semiconductor wafer 21.

Figure 6:
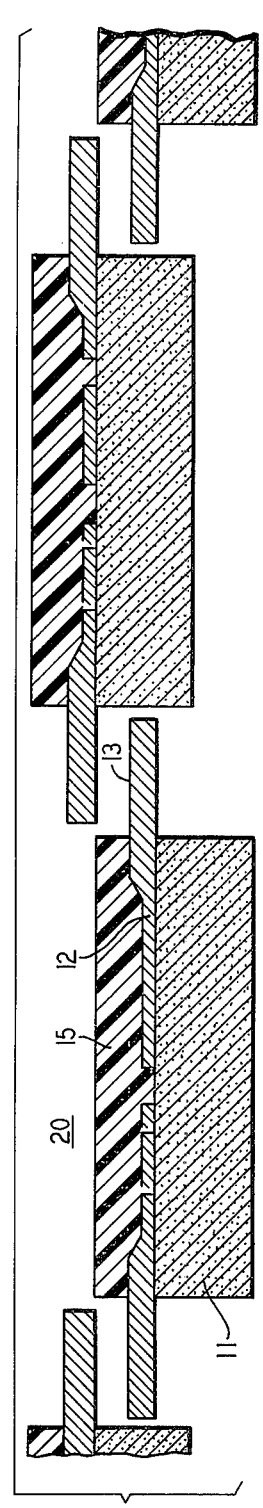
FIG. 6 is a sectional view of the separate semiconductor chips formed from such portion after formation of the protective film in accordance with this invention.

Finally, as shown in FIG. 6, after lapping and masking the back surface of the wafer and applying suitable etchants the wafer is separated precisely into individual chips 20 each of which has a resin film as a protective cap over the active surface of the device while the beam leads are uncoated to enable the bonding step utilized in assembling and connecting the device. Typically, such bonding is accomplished by thermocompression techniques, including ultrasonic bonding in which heat is internally generated. Fabrication of beam lead semiconductor devices is disclosed in M. P. Lepselter U.S. Pat. Nos. 3,287,612, 3,335,338 and 3,426,252.

Figure 7:
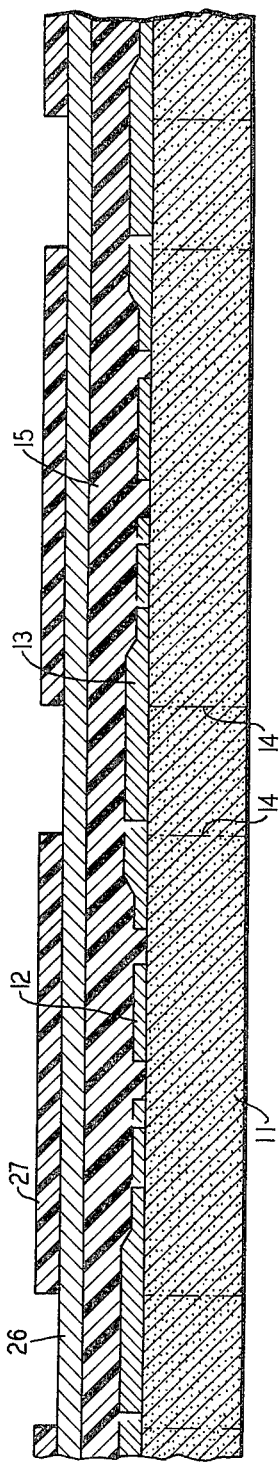

An alternative procedure to the masking technique illustrated by FIGS. 2 through 4 is to use a metal film mask to delineate the pattern to be etched in the silicone resin film. Referring to FIG. 7, this alternative method includes the formation of a metal film 26 on top of the silicone resin film 15. Then, a photoresist mask 27 is formed on top of the metal film 26 to delineate a pattern corresponding to the underlying semiconductor chips. The metal film comprises a layer of copper put down by evaporation to a thickness of about 3000 A to 5000 A. Aluminum of comparable thickness is a suitable alternative.

Figure 8:
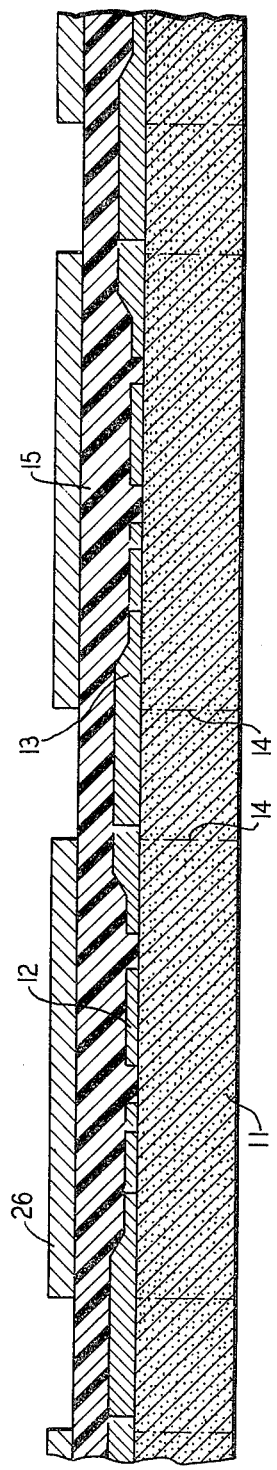
Figure 9:
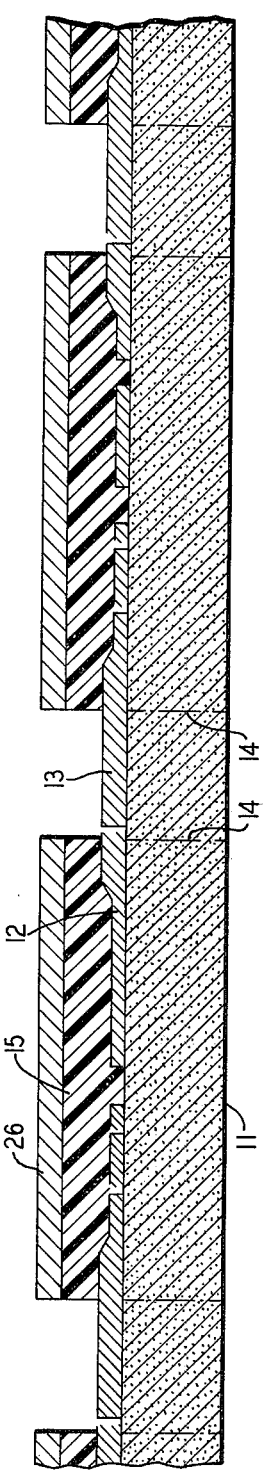

The pattern defined by the photoresist mask 27 is delineated by etching the exposed metal film using suitable solutions. For a copper film, nitric acid solution comprising two volumes of nitric acid (70 percent concentration) and three volumes of water may be used. If aluminum is used instead of copper, a suitable solvent comprises a solution of phosphoric acid (17 volumes), acetic acid (1 volume), nitric acid (1 volume) and water (1 volume) at 40° C. After the metal film 26 is etched the cross section is an illustrated in FIG. 8. Then as indicated in FIG. 9, the exposed portions of the silicone resin layer 15 are etched using the solvent referred to hereinbefore to form the chip pattern in the silicone resin layer 15. Subsequently, the metal film portions 26 remaining are removed using the solvents already disclosed and the wafer then is divided into chips as previously described. Alternatively, the metal film 26 may be deposited directly through a shadow mask to produce the desired pattern.

Although the invention is disclosed in terms of using a silicone resin, other etchable organic films may be used for which suitable solvents are available. In particular, the solvents disclosed herein are capable of fast, selective action in removing the exposed resin.

Further, although the process has been disclosed in terms of applying the protective resin following all device plating steps, it will be understood that the final electroplating to build up the beam leads may follow formation of the protective coating. In such procedure the coating is shaped so as to expose those portions of the beam leads which are to be additionally plated.

What is claimed is:

1. The process of fabricating a beam lead semiconductor device having an active device surface having beam leads affixed thereto and an oppositely disposed back surface, the device being adapted for mounting on a circuit board by means of pressure bonding said beam leads, said process including the formation of a protective silicone resin film upon only the active surface of the beam lead semiconductor device, the process comprising:
   1. applying to the active device surface of a semiconductor wafer containing an array of semiconductor devices having said beam leads affixed thereto a uniform film of a silicone resin;
   2. heating said wafer to cure said film;
   3. forming on the surface of said film a mask conforming to the desired configuration of the protective resin film;
   4. applying a solvent to remove the exposed resin film;
   5. removing the mask on the surface of the remaining resin overlying the wafer; and
   6. separating the wafer into individual semiconductor devices.

2. The process in accordance with claim 1 in which said silicone resin film is applied in a thickness of from about 0.1 to 0.3 mil.

3. The process of fabricating a beam lead semiconductor device having an active device surface having beam leads affixed thereto and an oppositely disposed back surface, the device being adapted for mounting on a circuit board by means of thermocompression bonding, said process including the formation of a protective silicone resin film upon only the active surface of the beam lead semiconductor device, the process comprising:

1. applying to the active device surface of a semiconductor wafer containing an array of semiconductor devices having said beam leads affixed thereto a uniform film of a silicone resin having a thickness of between 0.1 and 0.3 mil;
2. heating said wafer to cure said resin film;
3. forming on the surface of said film a metal mask conforming to the desired configuration of the protective resin film;
4. applying a solvent to remove the exposed resin film;
5. removing the metal mask on the surface of the remaining resin overlying the wafer; and
6. separating the wafer into individual semiconductor devices.

* * * * *